(12) United States Patent
Ikeji et al.

(10) Patent No.: US 9,076,957 B2
(45) Date of Patent: Jul. 7, 2015

(54) TERMINAL CAPABLE OF STOPPING FLOW OF OOZED CONDUCTIVE ADHESIVE, FLEXURE HAVING THE TERMINAL, AND HEAD SUSPENSION HAVING THE FLEXURE

(71) Applicant: NHK Spring Co., Ltd., Yokohama-shi, Kanagawa (JP)

(72) Inventors: Yoichi Ikeji, Kanagawa (JP); Jun Soga, Kanagawa (JP); Hideki Fuchino, Kanagawa (JP); Hiroshi Ono, Aikoh-gun (JP); Hiroaki Kamijo, Kanagawa (JP)

(73) Assignee: NHK Spring Co., Ltd., Kanagawa (JP)

( * ) Notice: Subject to any disclaimer, the term of this patent is extended or adjusted under 35 U.S.C. 154(b) by 292 days.

(21) Appl. No.: 13/828,570

(22) Filed: Mar. 14, 2013

(65) Prior Publication Data
US 2014/0377973 A1 Dec. 25, 2014

(30) Foreign Application Priority Data
Mar. 30, 2012 (JP) ................................. 2012-081086

(51) Int. Cl.
*H01L 41/047* (2006.01)
*H05K 1/00* (2006.01)
*G11B 5/48* (2006.01)

(52) U.S. Cl.
CPC .............. *H01L 41/0475* (2013.01); *H05K 1/00* (2013.01); *G11B 5/4873* (2013.01)

(58) Field of Classification Search
CPC ..... H01L 41/0475; G11B 5/4873; H05K 1/00
USPC ........................................... 360/245.8, 294.4
See application file for complete search history.

(56) References Cited

U.S. PATENT DOCUMENTS

| | | | | |
|---|---|---|---|---|
| 8,149,542 B2 * | 4/2012 | Ando | ........................ | 360/245.8 |
| 8,248,734 B2 * | 8/2012 | Fuchino | .................... | 360/294.4 |
| 8,339,748 B2 * | 12/2012 | Shum et al. | ................ | 360/245.8 |
| 8,351,160 B2 * | 1/2013 | Fujimoto | ................... | 360/245.8 |
| 8,390,958 B2 * | 3/2013 | Ohnuki et al. | ............. | 360/245.9 |
| 8,582,245 B2 * | 11/2013 | Hanya et al. | ............... | 360/245.9 |
| 8,634,166 B2 * | 1/2014 | Ohnuki et al. | ............. | 360/245.9 |
| 8,773,819 B2 * | 7/2014 | Ikeji et al. | .................. | 360/245.8 |
| 8,792,214 B1 * | 7/2014 | Bjorstrom et al. | ......... | 360/245.8 |
| 8,797,689 B1 * | 8/2014 | Pan et al. | .................... | 360/294.4 |
| 8,837,091 B2 * | 9/2014 | Arai | .......................... | 360/294.4 |
| 8,885,297 B1 * | 11/2014 | Bjorstrom et al. | ......... | 360/245.8 |
| 2010/0073825 A1 * | 3/2010 | Okawara | .................... | 360/294.4 |

FOREIGN PATENT DOCUMENTS

| | | |
|---|---|---|
| JP | 2010-086649 | 4/2010 |
| JP | 2010-154632 | 7/2010 |

* cited by examiner

*Primary Examiner* — Angel Castro
(74) *Attorney, Agent, or Firm* — Jordan and Hamburg LLP

(57) ABSTRACT

A terminal extending from a wiring member to face an electrode of a piezoelectric element and including a proximal end part and a distal end part with respect to the wiring member, the distal end part being connected to the electrode of the piezoelectric element through a conductive adhesive, comprising an insulating layer that faces the electrode of the piezoelectric element; a wiring layer laid on the insulating layer and connected to the electrode at the distal end part; and at least one liquid stopping recess provided on a surface facing the electrode at the proximal end part, the liquid stopping recess spanning between both edges of the insulating layer in an direction intersecting an extending direction of the proximal end part.

10 Claims, 12 Drawing Sheets

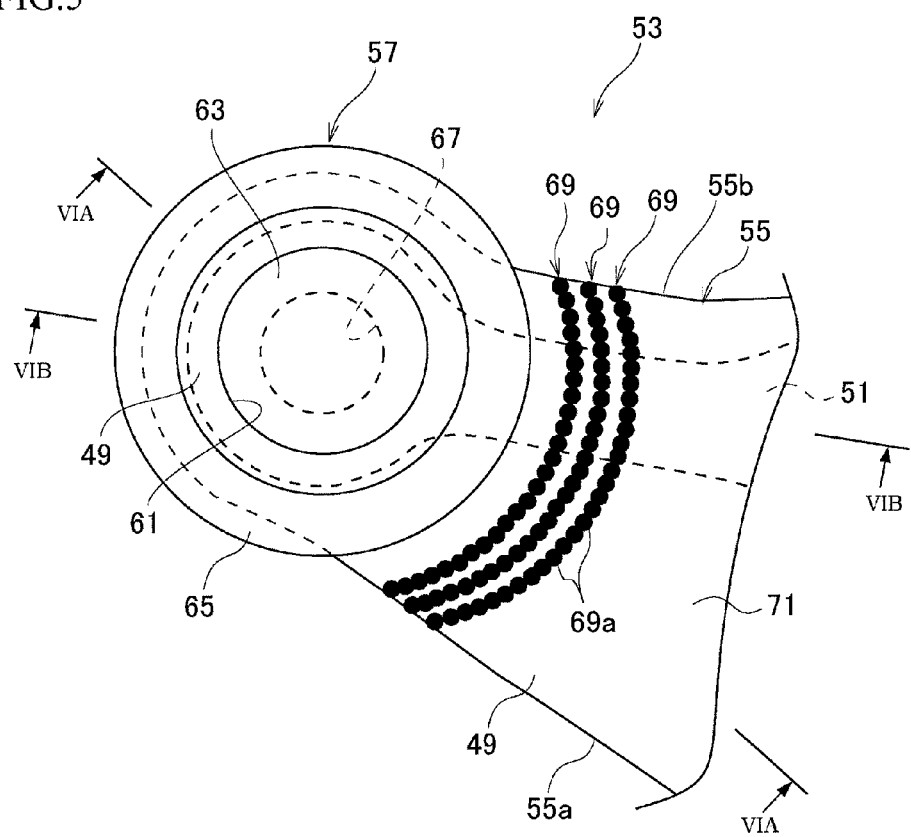

TERMINAL CAPABLE OF STOPPING FLOW OF OOZED CONDUCTIVE ADHESIVE, FLEXURE HAVING THE TERMINAL, AND HEAD SUSPENSION HAVING THE FLEXURE

BACKGROUND OF THE INVENTION

1. Field of the Invention

The present invention relates to a terminal for connection to an electrode of a piezoelectric element using a conductive adhesive, a flexure, and a head suspension.

2. Description of Related Art

In recent years, small-sized precision information devices have rapidly been developed, and for use with such devices, a demand for micro-actuators capable of position control for minute distances is increasing. Such micro-actuators are highly needed in the field of for example, optical systems for correcting focuses and inclination angles, ink jet printers, head actuators of magnetic disk drives, and the like.

As a technique that meets this need, a magnetic disk drive with a so-called dual actuator system is disclosed in, for example, Japanese Unexamined Patent Application Publication No. 2010-086649.

The magnetic disk drive with a dual actuator system is provided with a piezoelectric element for minute driving in addition to a voice coil motor. The voice coil motor drives a carriage to which a head suspension of the magnetic disk drive is attached. The piezoelectric element is located between a base plate and a load beam of the head suspension, to minutely drive the load beam relative to the base plate in accordance with the power supplied thereto.

Thus, the dual actuator system, in addition to turning the head suspension by the voice coil motor, minutely drives a head at a distal end of the head suspension in a sway direction through the load beam due to deformation of the piezoelectric element in accordance with the power applied thereto. This enables the head to be positioned with high accuracy.

In such a dual actuator system, a flexure is attached to the load beam as a wiring member, to supply power to the piezoelectric element through the flexure. The flexure is conductively connected to the piezoelectric element frequently by a conductive adhesive. For this, the flexure has a terminal that extends from a main body of the flexure to face the electrode of the piezoelectric element. The terminal has a distal end part that adheres to an electrode of the piezoelectric element through a conductive adhesive.

The conductive adhesive, however, may largely ooze out of and spread around the distal end part of the terminal due to its setting expansion or an excess in amounts filled.

In this case, capillary phenomenon often occurs in the oozed conductive adhesive between the terminal of the flexure and the electrode of the piezoelectric element, so that the oozed conductive adhesive flows along the terminal toward the main body of the flexure. As a result, the conductive adhesive reaches an attaching part to which the piezoelectric element is attached, the attaching part being defined by a conductive member to be located around the attached piezoelectric element between the base plate and the load beam. The conductive member functions as a ground for the piezoelectric element, and therefore, the conductive adhesive that reaches the attached part causes an electrical short circuit.

To cope with this problem, Japanese Unexamined Patent Application Publications Nos. 2010-154632 and 2010-165406 disclose that a liquid stopping ring is provided at a distal end part of a terminal and a conductive adhesive is applied inside the ring.

These related arts also disclose double liquid stopping rings that are concentrically arranged or an adhesive trap that communicates with the inside of the liquid stopping ring, capable of effectively preventing the conductive adhesive from oozing out of the distal end of the terminal.

In a case where the piezoelectric element is small-sized, however, the terminal of the flexure also becomes small-sized. The small-sized terminal may not be allowed to have the double rings, adhesive trap or the like as a structure for preventing the conductive adhesive from oozing out.

SUMMARY OF THE INVENTION

An object of the present invention is to provide a terminal, a flexure as a wiring member having the terminal and a head suspension having the flexure, capable of stopping a conductive adhesive that oozes out of a distal end part of a terminal from flowing along the terminal toward a wiring member.

In order to accomplish the object, an aspect of the present invention provides a terminal applicable to a flexure of a head suspension. The terminal extends from a wiring member to face an electrode of a piezoelectric element and includes a proximal end part and a distal end part with respect to the wiring member. The distal end part is connected to the electrode of the piezoelectric element through a conductive adhesive. The terminal comprises an insulating layer that faces the electrode of the piezoelectric element; a wiring layer laid on the insulating layer and connected to the electrode at the distal end part; and at least one liquid stopping recess provided on a surface facing the electrode at the proximal end part, the liquid stopping recess spanning between both edges of the insulating layer in an direction intersecting an extending direction of the proximal end part.

According to the aspect of the present invention, even if the conductive adhesive oozes out of the distal end part of the terminal, the conductive adhesive is stopped by the liquid stopping recess at the proximal end part from flowing along the terminal toward the wiring member.

BRIEF DESCRIPTION OF THE DRAWINGS

FIG. 5 is an enlarged plan view illustrating the terminal of the flexure of FIG. 4;

DETAILED DESCRIPTION OF EMBODIMENTS

Embodiments of the present invention will be explained. Each embodiment realizes a terminal capable of stopping a conductive adhesive that oozes out of a distal end part of a terminal from flowing along the terminal toward a wiring member. For this, the terminal of each embodiment includes an insulating layer that has a surface facing an electrode of a piezoelectric element and a liquid stopping recess formed on the surface of the insulating layer at a proximal end part of the terminal. The liquid stopping recess spans between both edges of the insulating layer in a direction intersecting an extending direction of the proximal end part.

The liquid stopping recess is preferably composed of continuous plural recesses formed on the insulating layer by photolytic degradation or of a slit-like recess formed by etching the insulating layer.

Hereinafter, each embodiment of the present invention will be explained in detail with reference to drawings.

Figure 1:
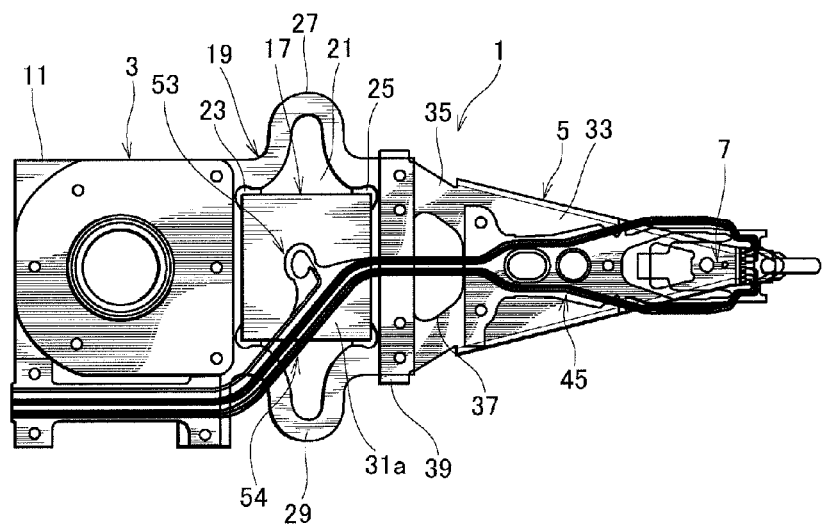
FIG. 1 is a plan view illustrating a head suspension with a flexure having a terminal according to a first embodiment of the present invention.
Figure 2:
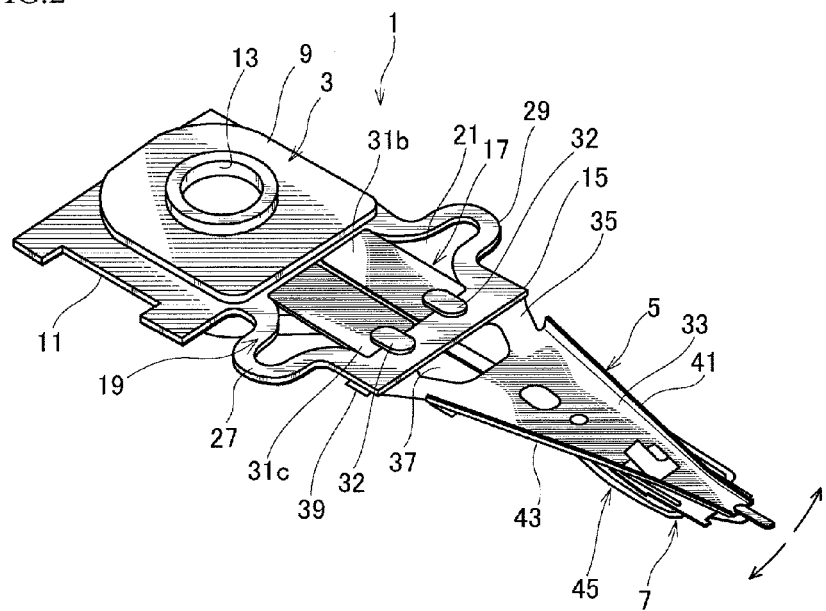
FIG. 2 is a perspective view illustrating the opposite side of the head suspension of FIG. 1.

First, a head suspension according to a first embodiment will be generally explained with reference to FIGS. 1-2 in which FIG. 1 is a schematic plan view illustrating the head suspension 1 with a flexure 45 having a terminal 53 and FIG. 2 is a perspective view illustrating the opposite side of the head suspension 1 of FIG. 1.

As illustrated in FIGS. 1 and 2, the head suspension 1 includes abase 3, a load beam 5 supported with the base 3, a head 7 arranged at a distal end on the flexure 45 that is attached to the load beam 5 for reading and writing data on a disk. The disk is incorporated in a hard disk drive.

The base 3 includes a base plate 9 made of conductive material such as stainless steel and a reinforcing plate 11 made of conductive material such as stainless steel. A proximal end of the reinforcing plate 11 is laid on the base plate 9 and joined thereto by, for example, laser welding.

The base plate 9 has an integral boss 13 and is attached to a carriage (not illustrated) through the boss 13. The carriage is driven by a voice coil motor (not illustrated), to turn the head suspension 1 as a whole.

A distal end of the reinforcing plate 11 includes a fixing part 15 for the load beam 5. At a portion closer to the proximal end relative to the fixing part 15, an attaching part 19 is formed on the reinforcing plate 11.

The attaching part 19 includes an opening 21 into which a piezoelectric element 17 is placed, and receivers 23 and 25 that are formed inside the opening 21 by, for example, etching to receive the piezoelectric element 17. The piezoelectric element 17 is fixed inside the opening 21 through a non-conductive adhesive. On both sides of the opening 21 in a sway direction of the head suspension 1, flexible parts 27 and 29 are provided.

The piezoelectric element 17 has a rectangular shape and is made of piezoelectric ceramics such as PZT (lead zirconate titanate). The piezoelectric element 17 has a common electrode 31a formed on one surface thereof by gold plating and a pair of electrodes 31b and 31c formed on the other surface by gold plating.

The piezoelectric element 17 is arranged between the base 3 and the load beam 5 and is deformed in accordance with the voltage applied thereto via the electrodes 31a, 31b and 31c, thereby minutely moving the head 7 through the load beam 5 in the sway direction relative to the base 3.

This enables the head suspension 1 to be turned by the voice coil motor and also the head 7 to be minutely moved by the piezoelectric element 17.

Incidentally, the electrodes 31b and 31c are grounded through conductive adhesives 32 to the reinforcing plate 11, and the electrode 31a is connected to the terminal 53 of the flexure 45.

The load beam 5 is joined to the fixing part 15 on the base 3 by, for example, laser welding and applies load to the head 7 which supports a slider (not illustrated) to read and write data on the disk. The load beam 5 is made of, for example, a metal thin plate such as a stainless steel thin plate and includes a rigid part 33 and a resilient part 35.

The resilient part 35 is forked by a central window 37 that reduces bending rigidity in a thickness direction of resilient part 35 or the head suspension 1. A proximal end of the resilient part 35 forms a fixed part 39 that is fixed to the fixing part 15 on the base 3.

The rigid part 33 extends distally from the resilient part 35 and has bends 41 and 43 formed along lateral edges of the rigid part 33 by box-bending. The bends 41 and 43 raise in a thickness direction of the rigid part 33 or head suspension 1. The rigid part 33 supports the slider of the head 7 at the distal end thereof through the flexure 45.

Figure 3:
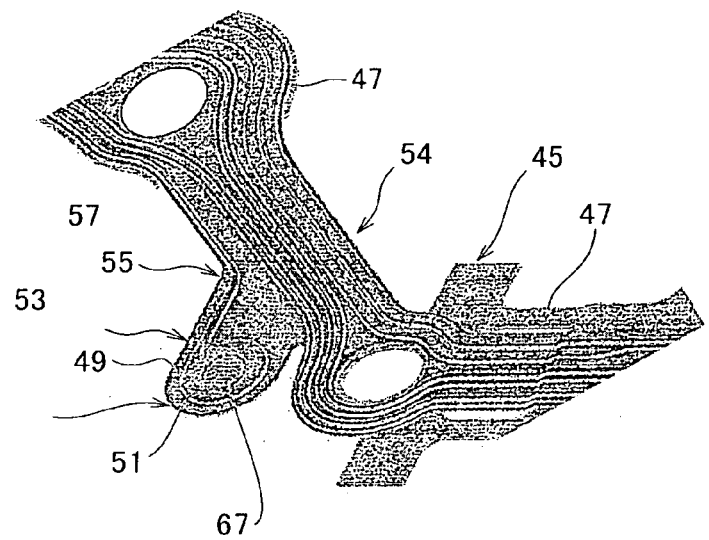
FIG. 3 is a partial perspective view illustrating the terminal of the flexure and its periphery according to the first embodiment of the present invention.
Figure 4:
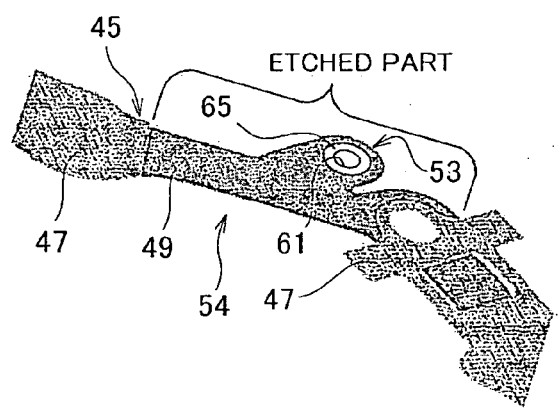
FIG. 4 is a partial perspective view illustrating the opposite side of the terminal of the flexure and its periphery of FIG. 3.
Figure 6A:
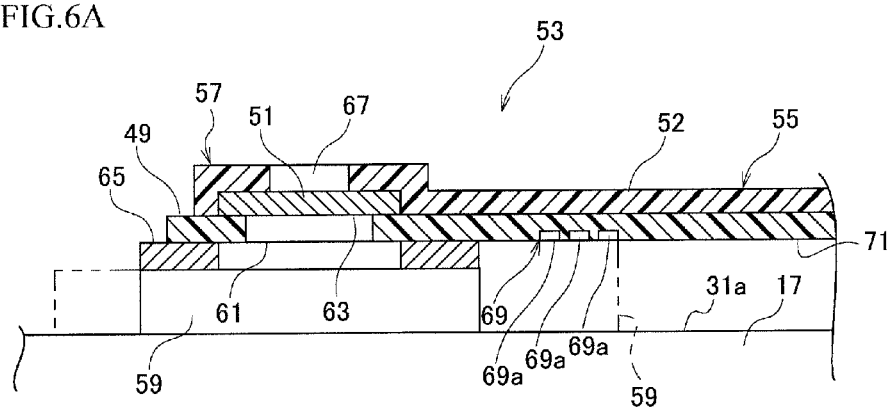
FIG. 6A is a sectional view taken along the line VIA-VIA of FIG. 5.
Figure 6B:
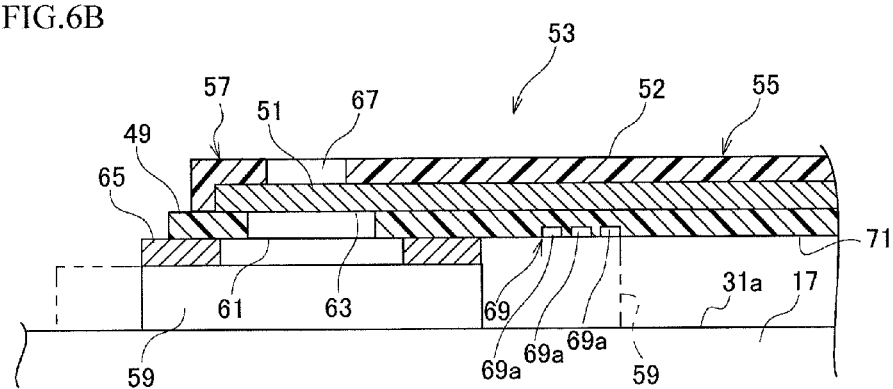
FIG. 6B is a sectional view taken along the line VIB-VIB of FIG. 5.

The flexure will be explained in detail with reference to FIGS. 3-6B. FIG. 3 is a partial perspective view illustrating the terminal 53 of the flexure 45 and its periphery. FIG. 4 is a partial perspective view illustrating the opposite side of the flexure 45 of FIG. 3. FIG. 5 is an enlarged plan view illustrating the terminal 53 of the flexure 45 of FIG. 4. FIG. 6A is a sectional view taken along the line VIA-VIA of FIG. 5 and FIG. 6B is a sectional view taken along the line VIB-VIB of the same. It should be noted that, although the flexure 45 illustrated in FIGS. 3-6B is slightly different from the flexure 45 illustrated in FIGS. 1 and 2 in shape, they are basically of the same structure.

The flexure 45, as illustrated in FIGS. 3 and 4, has a layer structure in which a metal layer 47, a base insulating layer 49 formed on the metal layer 47, a wiring layer 51 formed on the base insulating layer 49, and a cover insulating layer 52 formed on the wiring layer 51 are laid in this order. The metal layer 47 is oriented toward the piezoelectric element 17. The cover insulating layer 52 (FIG. 6) may be omitted.

The metal layer 47 is made of a conductive thin plate such as a resilient thin stainless steel rolled plate (SST) and has a thickness of for example, about 10 to 25 µm.

The base insulating layer 49 is made of an insulating material such as polyimide and has a thickness of, for example, about 5 to 20 µm.

The wiring layer 51 is formed in a predetermined pattern and has a thickness of, for example, about 4 to 15 µm. The wiring layer 51 has one end of its pattern conductively connected to the slider of the head 7 (FIG. 1) and the other end of its pattern connected to a terminal (not illustrated) for external connection.

The cover insulating layer 52 covers the wiring layer 51 for insulation and protection of the wiring layer 51 and is made of an insulating material such as polyimide. The thickness of the cover insulating layer 52 is set, for example, about 0.5 to 10 µm.

The flexure 45 has a middle part 54 passing over the electrode 31a of the piezoelectric element 17 (FIG. 1). At the middle part 54, the metal layer 47 of the flexure 45 is removed by etching or the like to prevent a short circuit between the electrode 31a of the piezoelectric element 17 and the surrounding conductive member such as the reinforcing plate 11. At the middle part 54, the terminal 53 is formed for connection to the electrode 31a of the piezoelectric element 17.

The terminal 53 will be explained in detail with reference to FIGS. 3-6B. The terminal 53, as illustrated in FIGS. 3 to 6B, extends from a main body of the flexure 45 to face the electrode 31a of the piezoelectric element 17. Although the terminal 53 is a part of the flexure 45, in the specification, the "flexure 45" means the main body of the flexure 45 excluding the terminal 53.

The terminal 53 basically has the same layered structure as the middle part 54 of the flexure 45 without the metal layer 47. In other words, the terminal 53, as illustrated in FIG. 6, has the base insulating layer 49 that faces the electrode 31a of the piezoelectric element 17, the wiring layer 51 laid on the base insulating layer 49, and the cover insulating layer 52 laid on the wiring layer 51.

The terminal 53, as illustrated in FIGS. 3 to 5, includes an elongate part 55 as a proximal end part that is integral with the flexure 45 and a tip part 57 as a distal end part.

At the elongate part 55, the base insulating layer 49 has a width that gradually narrows in a direction (width direction) intersecting an extending direction (longitudinal direction) of the terminal 53 or the elongate part 55 toward the tip part 57. The wiring layer 51 extends substantially in a straight line on the base insulating layer 49 at the elongate part 55.

At the tip part 57, the base insulating layer 49 forms a circular shape continuous from the elongate part 55 without reduction in the dimension in the width direction. The wiring layer 51, at the tip part 57, has a circular shape that swells with respect to the wiring layer 51 at the elongate part 55. The wiring layer 51 at the tip part 57 is fixedly connected to the electrode 31a of the piezoelectric element 17 using a liquid conductive adhesive 59 such as silver paste. That is, the tip part 57 is connected to the electrode 31a of the piezoelectric element 17 through the conductive adhesive 59. For this connection, a variety of structures may be employed.

According to the first embodiment, a base-side hole 61, as illustrated in FIG. 6, is formed through the base insulating layer 49 at the tip part 57. The wiring layer 51 is exposed through the base-side hole 61 to define a terminal surface 63 facing the electrode 31a of the piezoelectric element 17. The terminal surface 63 is plated with gold or the like so that electrical connectivity is improved.

Around the base-side hole 61, a liquid stopping ring 65 is provided on the surface of the insulating layer 49 that faces the electrode 31a of the piezoelectric element 17. The Liquid stopping ring is formed by partly leaving the metal layer 47 as a liquid stopping member at the time of etching. The liquid stopping ring 65 has an outer peripheral edges radially outwardly protruding from the base insulating layer 49 at the tip part 57 of the terminal 53.

The conductive adhesive 59 is filled and held in the base-side hole 61 and the liquid stopping ring 65 so that the electrode 31a of the piezoelectric element 17 adheres to the terminal surface 63 of the terminal 53 through the conductive adhesive 59.

When the electrode 31a adheres to the terminal surface 63 through the conductive adhesive 59, the liquid stopping ring 65 is disposed between the terminal 53 and the electrode 31a of the piezoelectric element 17 and narrows the gap between the terminal 53 and the electrode 31a. Due to the narrowed gap, capillary phenomenon occurs in the conductive adhesive 59 filled inside the base-side hole 61 and the liquid stopping ring 65.

As a result, the conductive adhesive 59 enters into in the narrowed gap, is diffused and held within the narrowed gap so that the conductive adhesive 59 is primarily held and solidified inside the liquid stopping ring 65 and the base-side hole 61 (solid line in FIGS. 6A and 6B).

The cover insulating layer 52 at the tip part 57 of the terminal 53 has a cover-side hole 67 formed through the cover insulating layer 52 at the side of the wiring layer 51 opposite the base-side hole 61. The cover-side hole 67 exposes the wiring layer 51 to the outside for a conduction test such as probing.

In the terminal 53, the elongate part 55 (proximal end part) has liquid stopping recesses 69 as illustrated in FIGS. 5 and 6. The liquid stopping recesses 69 are provided on a surface 71 of the base insulating layer 49 that faces the electrode 31a of the piezoelectric element 17.

According to the first embodiment, three liquid stopping recesses 69 are parallely provided in the extending direction of the elongate part 55 as a plurality of liquid stopping recesses. The number of liquid stopping recesses 69 is optional and may be one or two, or more than three.

Each liquid stopping recess 69 spans between both edges 55a and 55b in the width direction of the elongate part 55 (FIG. 5). The liquid stopping recess 69 according to the first embodiment forms a minute groove or a roughened surface on the base insulating layer 49 relative to the remaining surface thereof.

The liquid stopping recess 69 is composed of a row of laser irradiation marks. That is, the liquid stopping recess 69 includes a continuous plurality of minute recesses 69a that are formed on the base insulating layer 49 by photolytic degradation. The photolytic degradation is carried out by irradiating the base insulating layer 49 with a laser such as UV laser. Each minute recess 69a has approximately the same diameter as that of a UV laser spot.

Each liquid stopping recess 69 may be formed of a plurality of rows of laser irradiation marks, the plurality of rows of laser irradiation marks continuous to each other in the extending direction of the terminal 53. If, for example, two rows of laser irradiation marks are made continuous in the extending direction of the terminal 53, a liquid stopping recess 69 has a width equal with a total width of two rows. The liquid stopping recess 69 may be formed by irradiating a laser other than UV laser that is capable of photolytically degrading the base insulating layer 49.

The liquid stopping recesses 69 stop the conductive adhesive 59 from flowing along the elongate part 55 of the terminal 53 if the conductive adhesive oozes out of the tip part 57 (two-dotted line in FIGS. 6A and 6B).

The conductive adhesive 59 may flow over the liquid stopping ring 65 and ooze out of the tip part 57 of the terminal 53 due to, for example, setting expansion or an excess in amounts filled. In this case, capillary phenomenon may occur in the conductive adhesive 59 between the terminal 53 and the electrode 31a of the piezoelectric element 17, thereby causing the conductive adhesive 59 to flow along the elongate part 55 of the terminal 53 toward the flexure 45.

According to the first embodiment, the liquid stopping recesses 69 interrupt the capillary phenomenon in the conductive adhesive 59 or reduces wettability of the base insulating layer 49 so that the liquid stopping recesses 69 stop the conductive adhesive 59 from further flowing toward the flexure 45. In this way, the first embodiment accurately stops the flow of the oozed conductive adhesive 59 by the plural stopping recesses 69. However, even a single liquid stopping recess 69 is sufficient to stop the flow of the oozed conductive adhesive 59.

Figure 7:
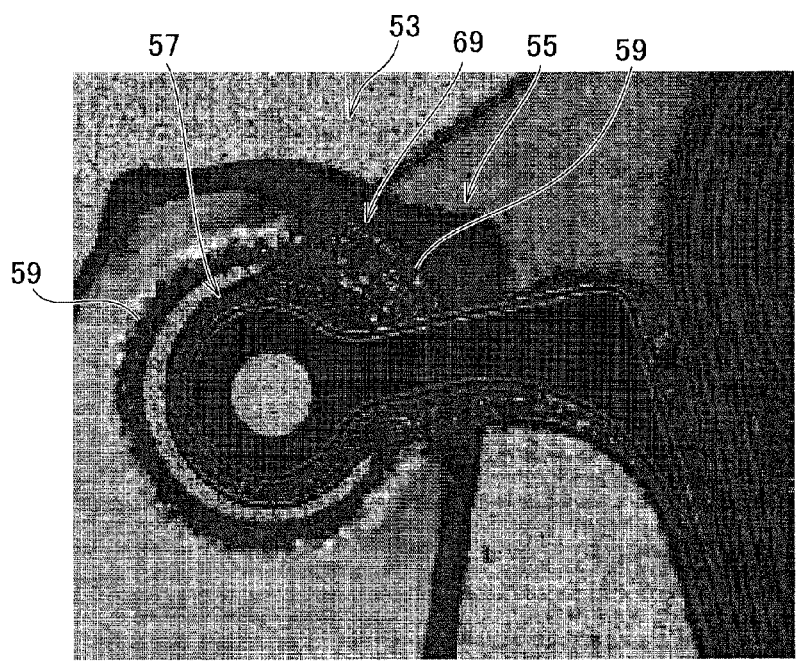
FIG. 7 is a photograph showing a result of an experiment on flow stop of a conductive adhesive according to the first embodiment of the present invention.

FIG. 7 is a photograph showing a result of an experiment on flow stop of a conductive adhesive. As is apparent from FIG. 7, although the conductive adhesive 59 oozes out of the tip part 57 of the terminal 53 and flows along the elongate part 55, the liquid stopping recesses 69 according to the first embodiment stop the flow of the oozed conductive adhesive 59 so as to keep the oozed conductive adhesive 59 within the tip part 57 side distal to the liquid stopping recesses 69.

Effects according to the first embodiment will be explained.

A terminal 53 extends from the flexure 45 as the wiring member to face the electrode 31a of the piezoelectric element 17 and includes the elongate part 55 as a proximal end part with respect to the flexure 45 and the tip part 57 as a distal end part with respect to the flexure 45, the tip part 57 being connected to the electrode 31a of the piezoelectric element 17 through the conductive adhesive 59. The terminal 53 comprises the base insulating layer 49 that faces the electrode 31a of the piezoelectric element 17, the wiring layer 51 laid on the base insulating layer 49 and connected to the electrode 31a at the tip part 57, and at least one liquid stopping recess 69 provided on the surface facing the electrode 31a at the elongate part 55, the liquid stopping recess 69 spanning between both edges 55a and 55b of the base insulating layer 49 in an direction intersecting an extending direction of the elongate part 55.

Accordingly, even if the conductive adhesive 59 flows toward the flexure 45 due to capillary phenomenon between the elongate part 55 of the terminal 53 and the electrode 31a of the piezoelectric element 17, the liquid stopping recess 69 interrupts the capillary phenomenon in the conductive adhesive 59 or reduces wettability of the base insulating layer 49. This stops the conductive adhesive 59 from further flowing toward the flexure 45.

In other words, even if the conductive adhesive 59 oozes out of the tip part 57 of the terminal 53, the conductive adhesive 59 is stopped from flowing along the terminal 53 toward the flexure 45. This improves connection quality between the terminal 53 and the piezoelectric element 17.

As a result, the first embodiment prevents an electrical short circuit between the piezoelectric element 17 and its peripheral conductive member(s) and keeps balance in rigidity, thereby connecting the terminal 53 and the piezoelectric element 17 through the conductive adhesive 59 with high quality.

According to the first embodiment, the liquid stopping recess 69 is composed of the continuous plurality of minute recesses 69a formed on the base insulating layer 49 through photolytic degradation.

As a result, even if a terminal may not employ a structure for preventing a conductive adhesive from oozing out of a tip part of the terminal, the liquid stopping recess 69 stopping the flow of the oozed conductive adhesive 59 can be easily and securely formed by irradiation of a UV laser or the like.

The liquid stopping recess 69 composed of the minute recesses 69a can reliably cut off the capillary phenomenon in the conductive adhesive 59 or reduce wettability of the base insulating layer 49 to securely stop the conductive adhesive 59 from further flowing toward the flexure 45.

According to the first embodiment, the plurality of liquid stopping recesses 69 can be parallelly provided on the base insulating layer 49 in the extending direction by photolytic degradation of the base insulating layer 49 due to irradiation of a UV laser or the like, thereby further reliably interrupting the capillary phenomenon in the conductive adhesive 59 or lower the wettability of the base insulating layer 49.

According to the first embodiment, the base-side hole 61 is formed through the base insulating layer 49 at the tip part 57 to expose the wiring layer 51 toward the electrode 31a of the piezoelectric element 17, the base-side hole 61 filled with the conductive adhesive 59, and the liquid stopping ring 65 as the liquid stopping member is disposed around the base-side hole 61 and interposed between the base insulating layer 49 of the terminal 53 and the electrode 31a of the piezoelectric element 17.

The gap between the base insulating layer 49 of the terminal 53 and the electrode 31a of the piezoelectric element 17 is narrowed to cause capillary phenomenon in the conductive adhesive 59 filled in the base-side hole 61 due to the narrowed gap.

As a result, the conductive adhesive 59 enters into in the narrowed gap, is diffused and held by capillary phenomenon within the narrowed gap defined by the liquid stopping ring 65. This allows the conductive adhesive 59 to be primarily solidified or set within the liquid stopping ring 65. If the conductive adhesive 59 oozes out of the tip part 57 of the terminal 53, flow of the oozed conductive adhesive 59 can be secondarily stopped by the liquid stopping recess 69 as described above.

In this way, the terminal 53 according to the first embodiment further improves connection quality between the terminal 53 and the piezoelectric element 17.

The flexure 45 having the terminal 53 stably and reliably supplies power to the piezoelectric element 17.

The head suspension 1 having the flexure 45 stably causes deformation of the piezoelectric element 17, and thus, stable minute driving of the head 7.

Figure 8:
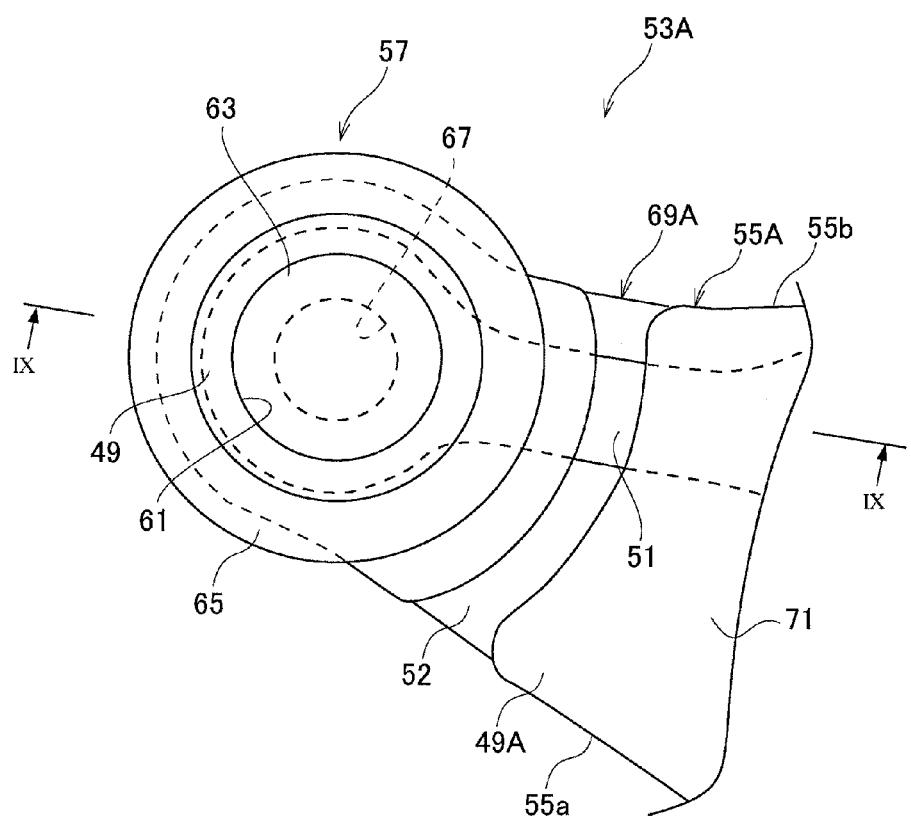
FIG. 8 is an enlarged plan view illustrating a terminal of a flexure according to a second embodiment of the present invention on the side facing a piezoelectric element.
Figure 9:
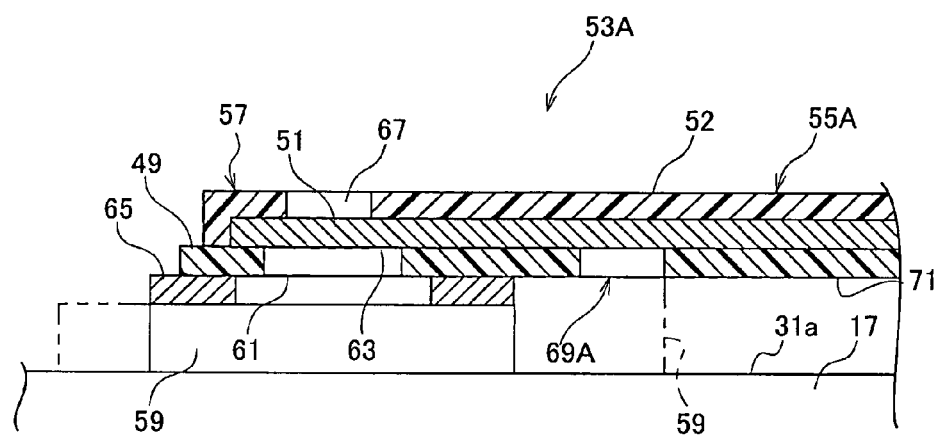
FIG. 9 is a sectional view taken along the line IX-IX of FIG. 8.

A second embodiment of the present invention will be explained in detail with reference to FIGS. 8-9 in which FIG. 8 is a plan view of a terminal 53A on the side facing a piezoelectric element 17 and FIG. 9 is a sectional view taken along a line IX-IX of FIG. 8. The terminal 53A of the second embodiment is basically the same as the terminal 53 of the first embodiment, and therefore, parts corresponding to those in the first embodiment will be represented with the same reference numerals or same reference numerals plus "A" to omit duplicate explanation.

According to the second embodiment, a liquid stopping recess 69A being a slit-like recess is formed instead of the liquid stopping recesses 69 in the first embodiment each composed of a continuous plurality of minute recesses 69a.

The liquid stopping recess 69A is formed in the base insulating layer 49A at an elongate part 55A by etching so that the base insulating layer 49A is separated by the liquid stopping recess 69A into front and rear parts in an extending direction of the terminal 53A or elongate part 55A. The liquid stopping recess may be formed in a recessed shape that leaves a part of the base insulating layer by partially etching the base insulating layer.

The separated front and rear parts of the base insulating layer 49A are connected together through the wiring layer 51 and the cover insulating layer 52 that extend across the liquid stopping recess 69A.

The second embodiment provides the same effects as the first embodiment. Additionally, since the liquid stopping recess 69A of the second embodiment is the slit-like recess formed by completely removing the base insulating layer 49 in a thickness direction of the base insulating layer 49 or the head suspension, it can be easily formed by etching.

Even with this configuration according to the second embodiment, the separated parts of the base insulating layer 49A can be connected together through the wiring layer 51 and the cover insulating layer 52 extending across the liquid stopping recess 69A as mentioned above. The wiring layer 51 above the liquid stopping recess 69A is not supported by the insulating layer 49A, however, it is reinforced by the cover insulating layer 52 that covers the wiring layer 51. This prevents the wiring layer 51 from damaging during an adhering work of the terminal 53A.

Figure 10:
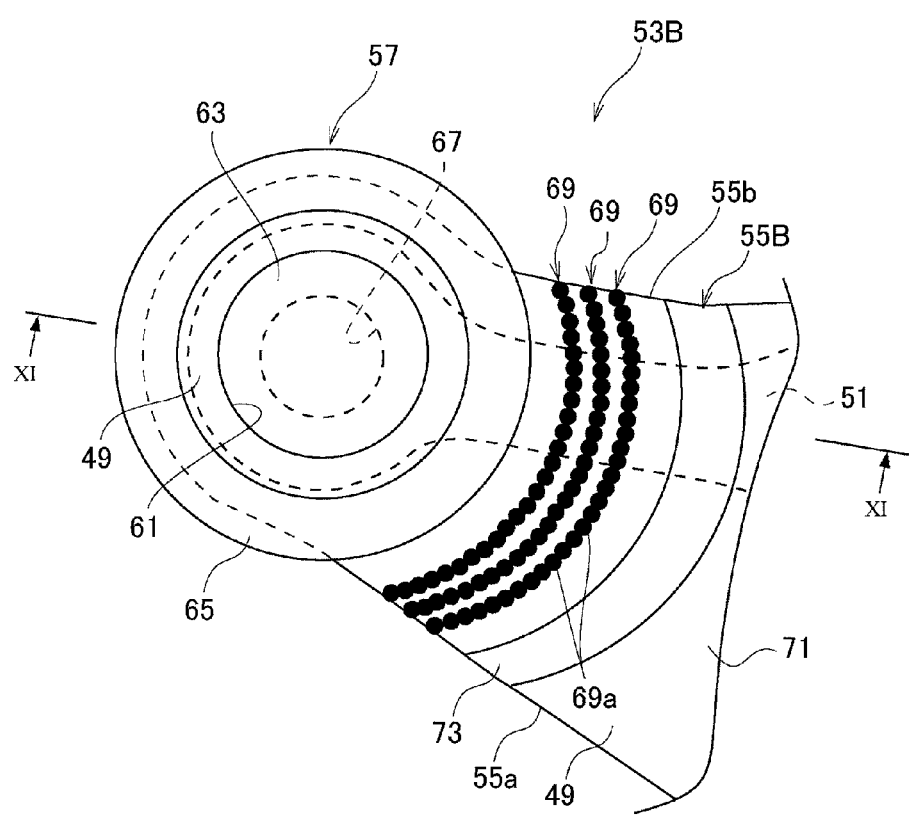
FIG. 10 is an enlarged plan view illustrating a terminal of a flexure according to a third embodiment of the present invention on the side facing a piezoelectric element.
Figure 11:
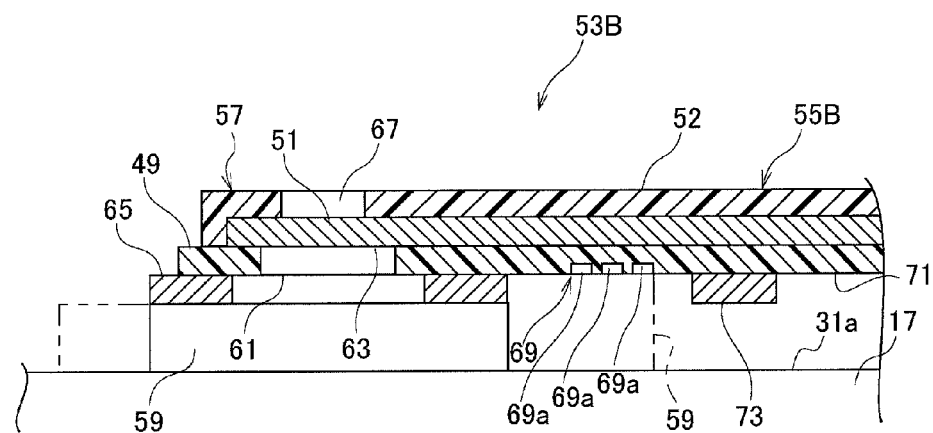
FIG. 11 is a sectional view taken along the line XI-XI of FIG. 10.

A third embodiment of the present invention will be explained in detail with reference to FIGS. 10-11 in which FIG. 10 is a plan view of a terminal 53B viewed from the piezoelectric element side and FIG. 11 is a sectional view taken along the line XI-XI of FIG. 10, as viewed as indicated by the arrow. The terminal 53B of the third embodiment is basically the same as the terminal 53 of the first embodiment, and therefore, parts corresponding to those in the first embodiment will be represented with the same reference numerals or same reference numerals plus "B" to omit duplicate explanation.

According to the third embodiment, as illustrated in FIGS. 10 and 11, a liquid stopping wall 73 is added to the terminal 53 of the first embodiment.

The liquid stopping wall 73 is provided at a part of an elongate part 55B closer to a proximal end (the flexure 45) of the terminal 53B with respect to liquid stopping recesses 69. The liquid stopping wall 73 is formed by partly leaving a metal layer 47, for example, at the time of etching. The liquid stopping wall 73 is interposed or disposed between the base insulating layer 49 and the piezoelectric layer 17 and spans between both edges 55a and 55b in a width direction of the elongate part 55B.

The third embodiment provides the same effects as the first embodiment.

Additionally, the gap between the terminal 53B and the piezoelectric element 17 is narrowed by the liquid stopping wall 73, thereby causing capillary phenomenon in a conductive adhesive 59. The conductive adhesive 59 enters the narrowed gap, and is diffused and held within the narrowed gap and stopped from flowing outside the liquid stopping wall 73.

As a result, even if the conductive adhesive 59 flows past the liquid stopping recess 69 toward the flexure 45 and reaches the liquid stopping wall 73, the conductive adhesive 59 is reliably stopped from further flowing beyond the liquid stopping wall 73.

Furthermore, even if a terminal may not employ a structure for preventing a conductive adhesive from oozing out of a front end of the terminal, the liquid stopping wall 73 stopping the flow of the oozed conductive adhesive 59 can be formed in the elongate part 55B on the proximal end side apart from the tip part 57B.

Figure 12:
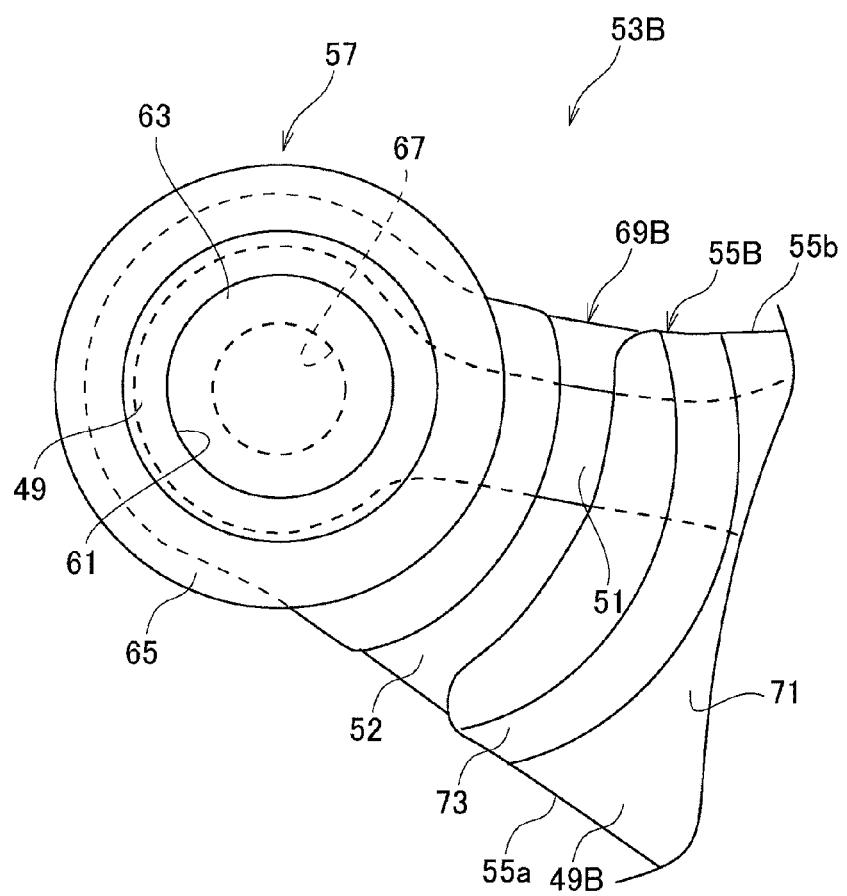
FIG. 12 is an enlarged plan view illustrating a terminal of a flexure according to a modification of the third embodiment of the present invention, as viewed from the piezoelectric element side.

The liquid stopping wall 73 of the third embodiment may be added to the structure in the second embodiment as illustrated in FIG. 12.

Figure 13:
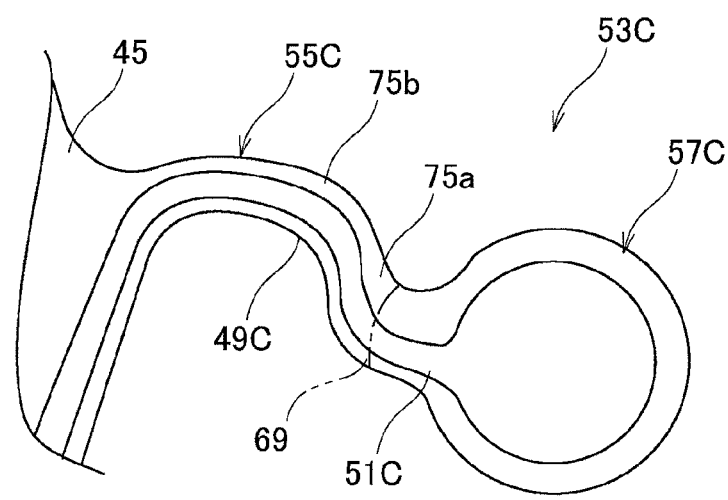
FIG. 13 is an enlarged schematic plan view illustrating a terminal of a flexure according to a fourth embodiment of the present invention.

A fourth embodiment of the present invention will be explained in detail with reference to FIG. 13 which is a schematic enlarged plan view of a terminal 53C of a flexure. The fourth embodiment is basically the same as the first embodiment, and therefore, parts corresponding to those in the first embodiment will be represented with the same reference numerals or same reference numerals plus "C" to omit duplicate explanation.

According to the fourth embodiment, the terminal 53C has an elongate part 55C whose planer shape has been changed relative to that in the first embodiment.

The elongate part 55C of the terminal 53C narrows in a width direction to define a constriction with respect to a tip part 57C and entirely curves. Namely, at least a part of the elongate part 55C closer to a proximal end (the flexure 45) with respect to the liquid stopping recess or recesses 69 narrows in the width direction relative to the tip part 57C and entirely curves.

According to the fourth embodiment, the base insulating layer 49C and a wiring layer 51C at the elongate part 55C curve generally in a crank shape. The base insulating layer 49C has a small width so that the base insulating layer 49C emulates or follows the wiring layer 51C. The curved parts 75a and 75b in the crank-shaped elongate part 55C are positioned closer to the proximal end (flexure 45) of the terminal 53C relative to the liquid stopping recess 69.

The fourth embodiment provides the same effects as the first embodiment. Additionally, if the conductive adhesive 59 flows beyond the liquid stopping recess 69 toward the flexure 45, the elongate part 55C can prevent the conductive adhesive 59 from further flowing toward the flexure 45.

The narrowed and crank-shaped elongate part of the fourth embodiment is applicable to the structure in the second or third embodiment.

Figure 14:
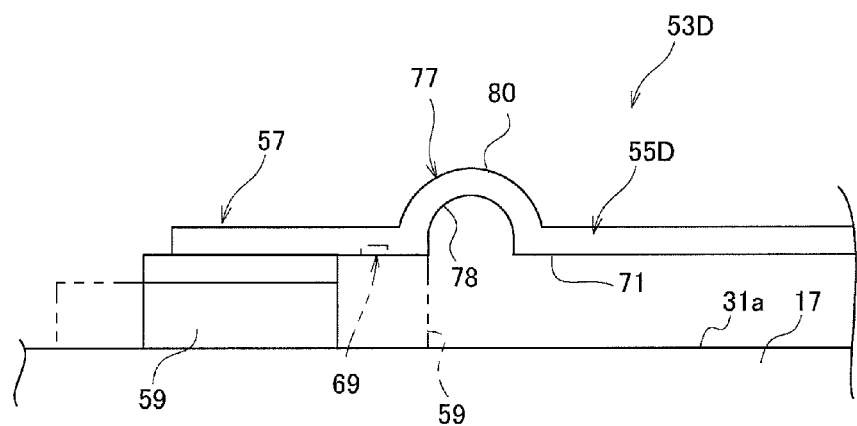
FIG. 14 is an enlarged schematic side view illustrating a terminal of a flexure according to a fifth embodiment of the present invention.

A fifth embodiment of the present invention will be explained in detail with reference to FIG. 14 which is a schematic side view of a terminal 53D of a flexure. The fifth embodiment is basically the same as the first embodiment, and therefore, parts corresponding to those in the first embodiment will be represented with the same reference numerals or same reference numerals plus "D" to omit duplicate explanation.

According to the fifth embodiment, an shifting part 77 is added to the structure in the first embodiment.

The shifting part 77 is formed at an elongate part 55D of the terminal 53D and shifted away from an electrode 31a of a piezoelectric element 17 as compared with the tip part 57.

According to the fifth embodiment, the shifting part 77 is formed on a part of the elongate part 55D closer to a proximal end (the flexure 45) with respect to a liquid stopping recess 69 and is curved by bending the part of the elongate part 55D in an arc shape. Due to this arc shape, the shifting part 77 has an arc-shaped recess 78 on the side facing the electrode 31a of the piezoelectric element 17 and an arc-shaped projection 80 on the opposite side facing away from the electrode 31a.

The fifth embodiment provides the same effects as the first embodiment. Additionally, the shifting part 77 enlarges the gap between the terminal 53D and the piezoelectric element 17, thereby interrupting capillary phenomenon.

As a result, if the conductive adhesive 59 flows beyond the liquid stopping recess 69 toward the flexure 45, the elongate part 55D stops the flow of the conductive adhesive 59 at the shifting part 77.

Figure 15:
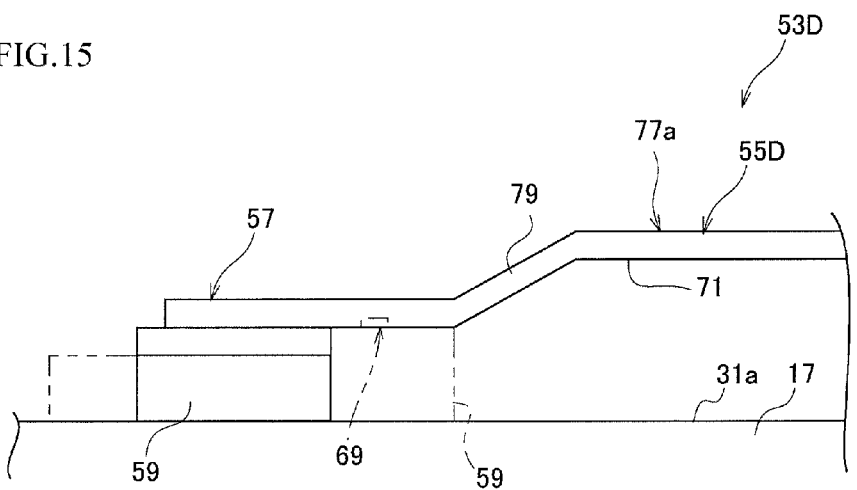
FIG. 15 is an enlarged schematic side view illustrating a terminal of a flexure according to a modification of the fifth embodiment of the present invention.

FIG. 15 is a schematic side view of a terminal 55D according to a modification of the fifth embodiment.

In the modification illustrated in FIG. 15, an shifting part 77a is formed by bending the elongate part 55D to have a slant or bent 79. The shifting part 77 entirely shifts a part of the elongate part 55D closer to the flexure 45 with respect to the slant 79 away from the electrode 31*a* of the piezoelectric element 17 compared with the tip part 57.

The modification provides the same effects as the fifth embodiment.

The shifting part 77 or 77*a* is applicable to the structure of any of the first to fourth embodiments.

What is claimed is:

1. A terminal extending from a wiring member to face an electrode of a piezoelectric element and including a proximal end part and a distal end part with respect to the wiring member, the distal end part being connected to the electrode of the piezoelectric element through a conductive adhesive, comprising:
    an insulating layer that faces the electrode of the piezoelectric element;
    a wiring layer laid on the insulating layer and connected to the electrode at the distal end part; and
    at least one liquid stopping recess provided on a surface of the insulating layer facing the electrode at the proximal end part, the liquid stopping recess spanning between both edges of the insulating layer in an direction intersecting an extending direction of the proximal end part.

2. The terminal according to claim 1, wherein the liquid stopping recess is composed of a continuous plurality of recesses formed on the insulating layer by photolytic degradation or of a slit-like recess formed in the insulating layer by etching.

3. The terminal according to claim 1, further comprising:
    a cover insulating layer laid on the wiring layer.

4. The terminal according to claim 1, wherein a plurality of the liquid stopping recesses are parallelly provided on the insulating layer in the extending direction.

5. The terminal according to claim 1, further comprising:
    a liquid stopping wall provided at a portion of the proximal end part closer to the wiring member with respect to the liquid stopping recess, the liquid stopping wall being interposed between the insulating layer and the piezoelectric element and spanning between both the edges of the insulating layer in the direction intersecting the extending direction.

6. The terminal according to claim 1, wherein at least a part of the proximal end part closer to the wiring member with respect to the liquid stopping recess narrows in the direction intersecting the extending direction relative to the distal end part and entirely curves.

7. The terminal according to claim 1, further comprising:
    a shifting part formed on a part of the proximal end part closer to the wiring member with respect to the liquid stopping recess, the shifting part shifted away from the electrode of the piezoelectric element relative to the distal end part.

8. The terminal according to claim 1, further comprising:
    a hole formed through the insulating layer at the distal end part to expose the wiring layer toward the electrode of the piezoelectric element, the hole filled with the conductive adhesive; and
    a liquid stopping member disposed around the hole and interposed between the insulating layer and the electrode of the piezoelectric element.

9. A flexure for supplying power to a piezoelectric element attached to a head suspension, the flexure being a wiring member that comprises the terminal according to claim 1.

10. A head suspension having the flexure according to claim 9, comprising;
    a base;
    a load beam supported with the base; and
    a head for reading and writing data arranged on the flexure that is attached to the load beam; and
    a piezoelectric element arranged between the base and the load beam and deformable in accordance with an applied voltage from the flexure to minutely move the head in a sway direction relative to the base.

* * * * *